(12) United States Patent
Yun et al.

(10) Patent No.: US 8,101,248 B2
(45) Date of Patent: Jan. 24, 2012

(54) COMPOSITION FOR FORMING SUBSTRATE, AND PREPREG AND SUBSTRATE USING THE SAME

(75) Inventors: Geum Hee Yun, Gyunggi-do (KR); Jun Rok Oh, Seoul (KR); Keun Yong Lee, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 6 days.

(21) Appl. No.: 12/692,439

(22) Filed: Jan. 22, 2010

(65) Prior Publication Data

US 2011/0121233 A1 May 26, 2011

(30) Foreign Application Priority Data

Nov. 26, 2009 (KR) .................. 10-2009-0115370

(51) Int. Cl.
C09K 19/38 (2006.01)
C09K 19/22 (2006.01)
C09K 19/32 (2006.01)
C09K 19/20 (2006.01)
C09K 19/34 (2006.01)
H01K 1/03 (2006.01)

(52) U.S. Cl. ................ 428/1.6; 428/901; 252/299.61; 252/299.62; 252/299.67; 174/255

(58) Field of Classification Search ............. 252/299.01, 252/299.67, 299.5; 174/250, 255; 361/748; 428/901, 1.6
See application file for complete search history.

(56) References Cited

U.S. PATENT DOCUMENTS

| | | | |
|---|---|---|---|
| 7,507,784 B2 * | 3/2009 | Dingemans et al. | 528/170 |
| 7,655,155 B2 * | 2/2010 | Jung et al. | 252/299.01 |
| 2002/0132933 A1 * | 9/2002 | Dingemans et al. | 525/437 |
| 2009/0117348 A1 * | 5/2009 | Cho et al. | 428/195.1 |
| 2009/0151987 A1 * | 6/2009 | Yang et al. | 174/250 |
| 2009/0308643 A1 * | 12/2009 | Cho et al. | 174/256 |
| 2010/0124037 A1 * | 5/2010 | Jung et al. | 361/783 |
| 2010/0139961 A1 * | 6/2010 | Kim et al. | 174/258 |
| 2010/0283004 A1 * | 11/2010 | Lee et al. | 252/299.65 |

* cited by examiner

*Primary Examiner* — Shean Wu
(74) *Attorney, Agent, or Firm* — Blakely Sokoloff Taylor & Zafman LLP

(57) ABSTRACT

Disclosed herein is a composition for forming a substrate, including: a compound prepared by polymerizing a liquid crystal thermosetting oligomer having one or more soluble structural units in a main chain thereof and having a thermosetting group at one or more of two ends of the main chain thereof with a fluorine compound having a functional group which can react with the main chain of the liquid crystal thermosetting oligomer.

19 Claims, 1 Drawing Sheet

SOLUBLE LCT + FLUORINE COMPOUND
(HAVING THERMOSETTING GROUPS (HAVING FUNCTIONAL GROUPS
AT ENDS THEREOF) WHICH REACT WITH MAIN CHAIN OF LCT)

FLORINE COMPOUND IS INTRODUCED
INTO MAIN CHAIN OF LCT BY COVALENT BONDING

SOLUBLE LCT     +     FLUORINE COMPOUND
(HAVING THERMOSETTING GROUPS      (HAVING FUNCTIONAL GROUPS
AT ENDS THEREOF)      WHICH REACT WITH MAIN CHAIN OF LCT)

FLORINE COMPOUND IS INTRODUCED
INTO MAIN CHAIN OF LCT BY COVALENT BONDING

COMPOSITION FOR FORMING SUBSTRATE, AND PREPREG AND SUBSTRATE USING THE SAME

CROSS REFERENCE TO RELATED APPLICATION

This application claims the benefit of Korean Patent Application No. 10-2009-0115370, filed Nov. 26, 2009, entitled "Composition for forming substrate, and prepreg and substrate using the same", which is hereby incorporated by reference in its entirety into this application.

BACKGROUND OF THE INVENTION

1. Technical Field

The present invention relates to a composition for forming a substrate, and a prepreg and substrate using the same.

2. Description of the Related Art

With the advance of electronic appliances, printed circuit boards are becoming light, thin and miniaturized. In order to meet these requirements, the wiring of printed circuit boards is becoming more complicated and highly-densified. As such, electrical, thermal and mechanical stability are important factors in the manufacture of a substrate. Among these, the coefficient of thermal expansion (CTE) is a particularly important factor influencing reliable manufacture of a substrate.

Further, with the development of advanced technologies, the frequency band used in information and communication equipment is becoming higher. In particular, the frequency band of ultrahigh-speed wireless communication appliances has been broadened to several tens of GHz.

However, the conventional insulating material of printed circuit boards, using an epoxy resin, cannot be used in the high frequency region. Generally, a polymer material, serving as the insulating material of printed circuit boards, must have a low dielectric constant in order to be used in the high-speed high-frequency region. However, since the insulating material using an epoxy resin has a relatively high dielectric constant of 4 or more, it interferes with signal transmission of a circuit in the high frequency region, thus increasing signal loss.

In order to solve the above problem, polytetrafluoroethylene (PTFE) having a low dielectric constant is used as an insulating material of printed circuit boards. However, PTFE is problematic to be used as a raw material of printed circuit board because it has poor mechanical properties and low adhesivity to copper foil although it has excellent electrical properties and corrosion resistance to solvents.

Therefore, it is keenly required to develop substrate materials which can satisfy thermal and mechanical properties required to realize thin and highly-densified integrated circuit patterns and which have excellent electrical properties.

SUMMARY OF THE INVENTION

Hence, research into solving the above problem has been continuously made. As a result, it was found that an insulating material composition for a substrate which has excellent thermal, electrical and mechanical stability can be obtained by introducing fluorine compounds into a main chain of a liquid crystal thermosetting (LCT) oligomer. Based on this finding, the present invention was completed.

Accordingly, the present invention provides a composition for forming a substrate, having excellent thermal and mechanical properties, and a prepreg and substrate using the composition.

Further, the present invention provides a composition for forming a substrate, having excellent electrical properties, and a prepreg and substrate using the composition.

An aspect of the present invention provides a composition for forming a substrate, including: a compound prepared by polymerizing a liquid crystal thermosetting oligomer having one or more soluble structural units in a main chain thereof and having a thermosetting group at one or more of the two ends of the main chain thereof with a fluorine compound having a functional group which can react with the main chain of the liquid crystal thermosetting oligomer.

In the liquid crystal thermosetting oligomer, the soluble structural unit may include an aryl-amine group of C4~C30 or an aryl-amide group of C4~C30.

The soluble structural unit may include a compound represented by Chemical Formula 1 below:

[Chemical Formula 1]

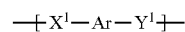

wherein Ar is an aryl group of C4~C30; and $X^1$ and $Y^1$ are each independently selected from the group consisting of COO, O, CONR", NR''' and CO, in which R" and R''' are each independently selected from the group consisting of a hydrogen atom, an alkyl group of C1~C20 and an aryl group of C6~C30, and one or more of $X^1$ and $Y^1$ are CONR" or NR'''.

The soluble structural unit may include one or more structural units selected from compounds represented by Chemical Formula 2 below:

[Chemical Formula 2]

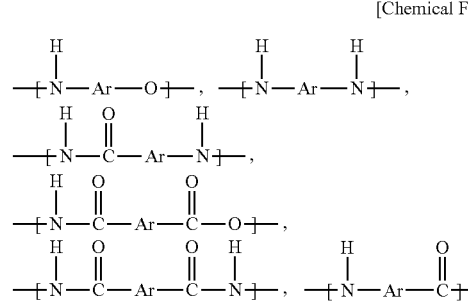

wherein Ar is an aryl group of C4~C30.

Here, the Ar may be an aryl group or a substitute thereof selected from among compounds represented by Chemical Formula 3 below:

[Chemical Formula 3]

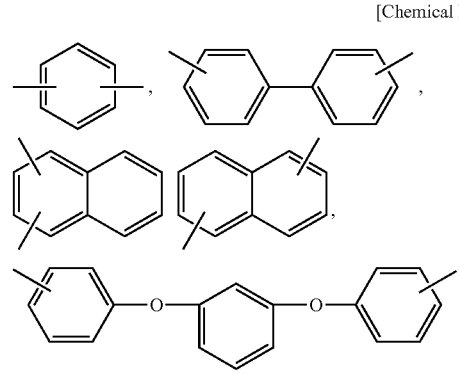

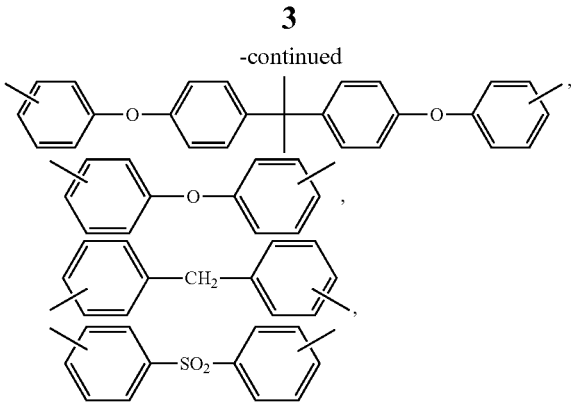

Meanwhile, the soluble structural unit may be included in a molar ratio of more than 5 mol % and 60 mol % or less based on a total of structural units.

Further, the liquid crystal thermosetting oligomer may further include a structural unit represented by Chemical Formula 4 below in a main chain thereof:

[Chemical Formula 4]

wherein Ar is an aryl group of C4~C30; and $X^2$ and $Y^2$ are each independently selected from the group consisting of COO, O, CONR", NR''' and CO, in which R" and R''' are each independently selected from the group consisting of a hydrogen atom, an alkyl group of C1~C20 and an aryl group of C6~C30.

The structural unit represented by Chemical Formula 4 above may include one or more structural units selected from compounds represented by Chemical Formula 5 below:

[Chemical Formula 5]

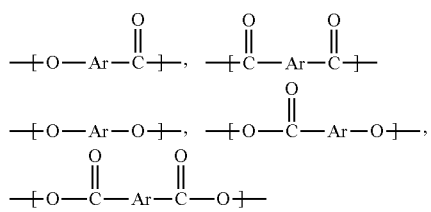

wherein Ar is an aryl group of C4~C30.

Here, the Ar may be selected from among compounds represented by Chemical Formula 3 below:

[Chemical Formula 3]

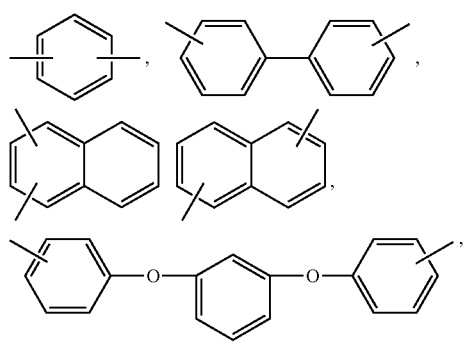

The thermosetting group may be a thermo-crosslinkable reaction group.

The thermosetting group may be selected from the group consisting of maleimide, nedimide, phthalimide, acetylene, propargyl ether, benzocyclobutene, cyanate, and substitutes or derivatives thereof.

The liquid crystal thermosetting oligomer may be a compound represented by Chemical Formula 6 below:

$$Z—(R^1)_m—(R^2)_n—Z^2 \qquad \text{[Chemical Formula 6]}$$

wherein $R^1$ is one or more structural units selected from among compounds represented by Chemical Formula 2 below; $R^2$ is one or more structural units selected from among compounds represented by Chemical Formula 5 below; $Z^1$ and $Z^2$ are identical to or different from each other, and are each independently selected from the group consisting of hydrogen, halogen, a hydroxy group, maleimide, nedimide, phthalimide, acetylene, propargyl ether, benzocyclobutene, cyanate, and substitutes or derivatives thereof; one or more of $Z^1$ and $Z^2$ are selected from the group consisting of maleimide, nedimide, phthalimide, acetylene, propargyl ether, benzocyclobutene, cyanate, and substitutes or derivatives thereof; n and m are each independently an integer of 1~50; and n/(n+m+2) is from more than 5% to 60% or less:

[Chemical Formula 2]

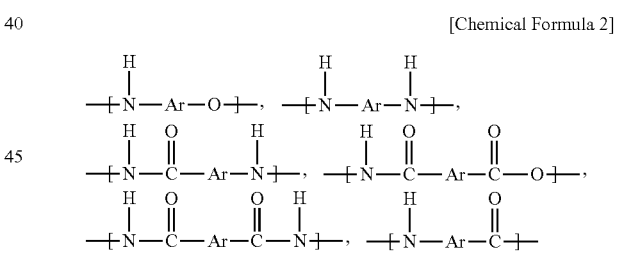

where, Ar is an aryl group of C4~C30;

[Chemical Formula 5]

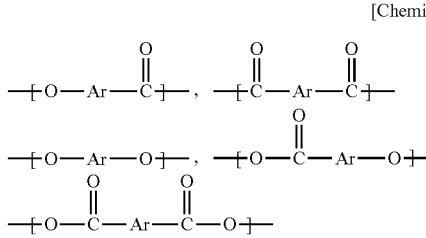

where, Ar is an aryl group of C4~C30.

The liquid crystal thermosetting oligomer may be a compound represented by Chemical Formula 7 or Chemical Formula 8 below:

[Chemical Formula 7]

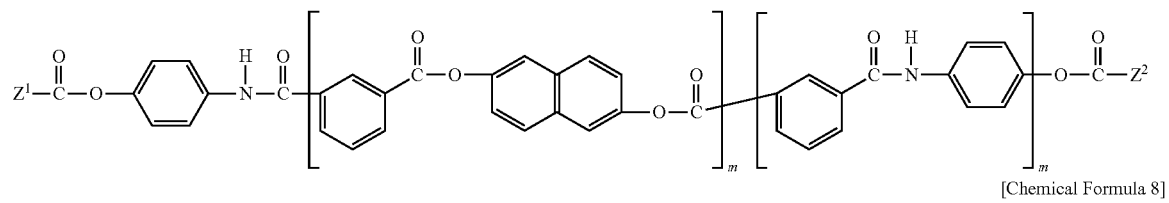

[Chemical Formula 8]

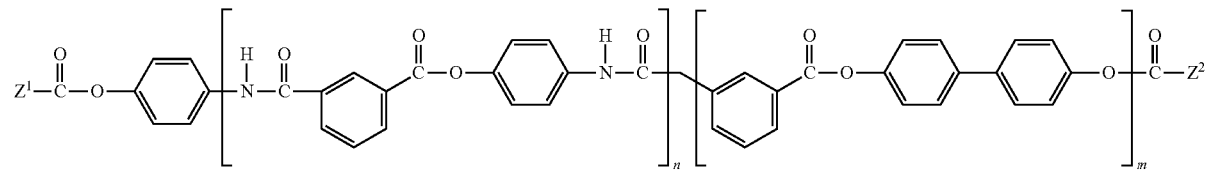

wherein $Z^1$ and $Z^2$ are identical to or different from each other, and are each independently selected from the group consisting of maleimide, nedimide, phthalimide, acetylene, propargyl ether, benzocyclobutene, cyanate, and substitutes or derivatives thereof; m is an integer of 1~50; and n is an integer of 1~50.

The liquid crystal thermosetting oligomer may have a number average molecular weight of 500~15,000.

The functional group which can react with the main chain of the liquid crystal thermosetting oligomer may be one or more selected from among —COOH, —OH, —NH$_2$ and —Cl.

The fluorine compound is selected from among compounds represented by Chemical Formula 9 below:

[Chemical Formula 9]

-continued wherein p is an integer of 1~10.

Further, the composition may further include an inorganic filler.

Another aspect of the present invention provides a prepreg prepared using the composition.

Still another aspect of the present invention provides a substrate manufactured using the composition.

Various objects, advantages and features of the invention will become apparent from the following description of embodiments with reference to the accompanying drawing.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe the best method he or she knows for carrying out the invention.

BRIEF DESCRIPTION OF THE DRAWINGS

The above and other objects, features and advantages of the present invention will be more clearly understood from the following detailed description taken in conjunction with the accompanying drawing, in which.

DESCRIPTION OF THE PREFERRED EMBODIMENTS

Figure 1:
FIG. 1 is a schematic view showing the polymerization of reactants included in a composition for forming a substrate according to the present invention.

The objects, features and advantages of the present invention will be more clearly understood from the following detailed description and preferred embodiments taken in conjunction with the accompanying drawing. In the description of the present invention, when it is determined that the detailed description of the related art would obscure the gist of the present invention, the description thereof will be omitted.

Hereinafter, preferred embodiments of the present invention will be described in detail with reference to the attached drawing.

FIG. 1 is a schematic view showing the polymerization of reactants included in a composition for forming a substrate according to the present invention.

As shown in FIG. 1, the composition for forming a substrate according to the present invention includes a compound prepared by polymerizing a liquid crystal thermosetting oligomer having one or more soluble structural units in a main chain thereof and having a thermosetting group at one or more of the two ends of the main chain thereof with a fluorine compound having a functional group which can react with the main chain of the liquid crystal thermosetting oligomer.

Specifically, in the present invention, a soluble liquid crystal thermosetting oligomer is used instead of a commonly-used epoxy resin. The liquid crystal thermosetting oligomer has a structure by which the characteristics of liquid crystal can be realized and a soluble structure by which it can be dissolved in a solvent. Further, the liquid crystal thermosetting oligomer has thermally-curable structures at one or more of the two ends thereof.

That is, the liquid crystal thermosetting oligomer has one or more soluble structural units in a main chain thereof and has a thermosetting group at one or more of both ends of the main chain thereof. The term "soluble" means that the solubility of the liquid crystal thermosetting oligomer in a solvent used in the composition is high.

Generally, since a polymer resin has very high viscosity, it is difficult to increase its solid content even when it is melted and then used or dissolved in a solvent and then used. In particular, when a polymer resin is impregnated into a nonwoven glass fiber fabric, it is difficult to impregnate the polymer resin into the nonwoven glass fiber fabric because the polymer resin has high viscosity, and, particularly, when the polymer resin has low solid content, since the amount of the polymer resin impregnated in the nonwoven glass fiber fabric is insufficient, reprocessing is required, thus increasing processing costs. Contrasted with this polymer resin, since the liquid crystal thermosetting oligomer has low viscosity, and the dielectric constant, thermal expansion coefficient and absorption resistance thereof are high, plus it is extremely soluble in a solvent, manufacturing costs can be reduced when it is used as a raw material of a variety of substrates.

The soluble structural unit included in the main chain of the liquid crystal thermosetting oligomer may be an aryl-amine group of C4~C30 or an aryl-amide group of C4~C30. The soluble structural unit may include a structural unit represented by Chemical Formula 1 below:

Chemical Formula 1

$$-\!\!\!+\!\!X^1-\text{Ar}-Y^1\!\!+\!\!-$$

wherein Ar is an aryl group of C4~C30; and $X^1$ and $Y^1$ are each independently selected from the group consisting of COO, O, CONR'', NR'' and CO, in which R''' and R''' are each independently selected from the group consisting of a hydrogen atom, an alkyl group of C1~C20 and an aryl group of C6~C30, and one or more of $X^1$ and $Y^1$ are CONR'' or NR'''.

The soluble structural unit may include, but is not limited to, one or more structural units selected from compounds represented by Chemical Formula 2 below:

Chemical Formula 2

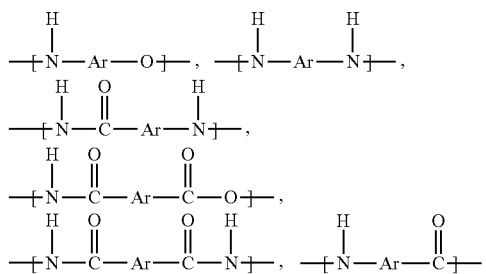

wherein Ar is an aryl group of C4~C30.

In the structural units constituting the liquid crystal thermosetting oligomer, the types of Ar used are identical to or different from each other, and the aromatic ring of Ar may have an amide group, ester group, carboxyl group, alkoxy group, aryl group or fluoromethyl group as a substituent thereon.

Examples of the Ar may include compounds represented by Chemical Formula 3:

Chemical Formula 3

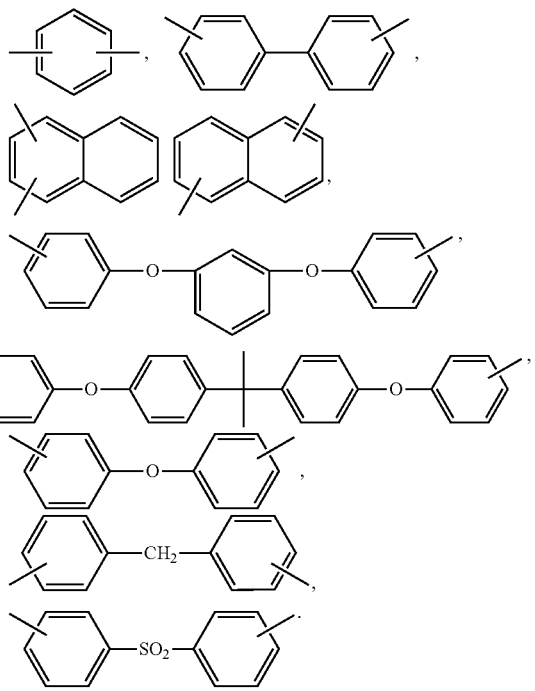

The liquid crystal thermosetting oligomer may include a soluble structural unit such that the molar ratio of the soluble structural unit is more than 5 mol % and less than or equal to 60 mol % based on a total of structural units. When the molar ratio of the soluble structural unit is 5 mol % or less, there is a problem in that the solubility of the liquid crystal thermosetting oligomer in a solvent is only slightly improved. In contrast, when the molar ratio of the soluble structural unit is more than 60 mol %, there is a problem in that the hydrophilicity of the liquid crystal thermosetting oligomer increases, and thus the absorption resistance thereof decreases. The amount of the soluble structural unit included in the liquid crystal thermosetting oligomer can be set to a desired level by adjusting the amount of monomer added at the time of reaction. The amount of the soluble structural unit can be adjusted by changing the size, weight, properties and chemical composition thereof.

The liquid crystal thermosetting oligomer may further include a structural unit represented by Chemical Formula 4 below in a main chain thereof:

Chemical Formula 4

$$-\!\!\!+\!X^2-Ar-Y^2\!\!+\!\!-$$

wherein Ar is an aryl group of C4~C30; and $X^2$ and $Y^2$ are each independently selected from the group consisting of COO, O, CONR", NR'" and CO, in which R" and R'" are each independently selected from the group consisting of a hydrogen atom, an alkyl group of C1~C20 and an aryl group of C6~C30.

Examples of the structural unit represented by Chemical Formula 4 above may include one or more structural units selected from compounds represented by Chemical Formula 5 below:

Chemical Formula 5

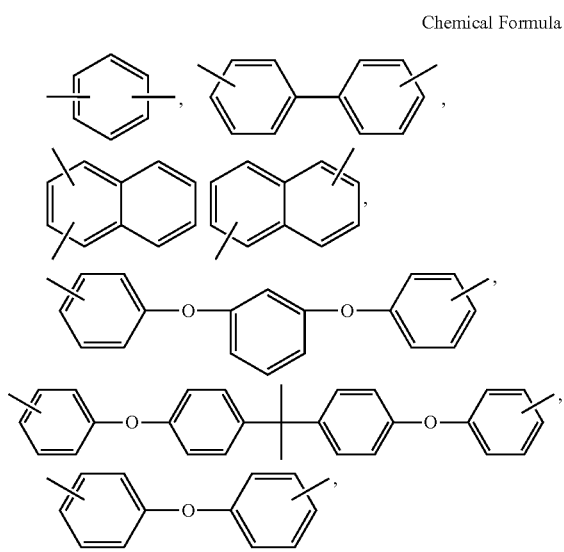

wherein Ar is an aryl group of C4~C30.

When the structural unit represented by Chemical Formula 4 above includes two or more structural units selected from the compounds represented by Chemical Formula 5 above, the types of Ar of the respective structural units are identical to or different from each other, and the aromatic ring of Ar may have an amide group, ester group, carboxyl group, alkoxy group, aryl group or fluoromethyl group as a substituent thereon. Specifically, the Ar may be selected from among compounds represented by Chemical Formula 3 below:

Chemical Formula 3

The liquid crystal thermosetting oligomer may include one or more thermosetting groups, which are identical to or different from each other, at one or more of the two ends of the main chain thereof. When the composition for forming a substrate is used to manufacture a printed circuit board, the thermosetting groups are cross-linked with each other through high-temperature curing to form a stable reticular structure, thus improving the mechanical properties of the printed circuit board.

The thermosetting group may be a thermo-crosslinkable reaction group. The thermosetting group is selected from the group consisting of maleimide, nedimide, phthalimide, acetylene, propargyl ether, benzocyclobutene, cyanate, and substitutes or derivatives thereof, but the present invention is not limited thereto. The term "substitute" means a structure in which a part of the ends of a thermo-crosslinkable reaction group is substituted with a substituent group, such as an alkyl group, halogen atom, aryl group or the like. For example, in the case of a maleimide reaction group, examples of the substitute may include structures in each of which one or more hydrogen atoms present in a double bond of the maleimide reaction group are substituted with an alkyl group, such as a methyl group or the like. The term "derivative" means a structure in which a thermo-crosslinkable reaction group is bonded with an aromatic group, a hetero-aromatic group or the like. For example, in the case of a maleimide reaction group, examples of the derivative may include structures in which a maleimide reaction group is bonded with benzene or naphthalene.

The liquid crystal thermosetting oligomer may be a compound represented by Chemical Formula 6 below:

$$Z^1-\!(R^1)_m-\!(R^2)_n-\!Z^2 \qquad \text{Chemical Formula 6}$$

wherein $R^1$ is one or more structural units selected from among compounds represented by Chemical Formula 2 below; $R^2$ is one or more structural units selected from among compounds represented by Chemical Formula 5 below; $Z^1$ and $Z^2$ are identical to or different from each other, and are each independently selected from the group consisting of hydrogen, halogen, a hydroxy group, maleimide, nedimide, phthalimide, acetylene, propargyl ether, benzocyclobutene, cyanate, and substitutes or derivatives thereof; n and m are each independently a positive integer, preferably, an integer of 1~50:

Chemical Formula 2 where, Ar is an aryl group of C4~C30;

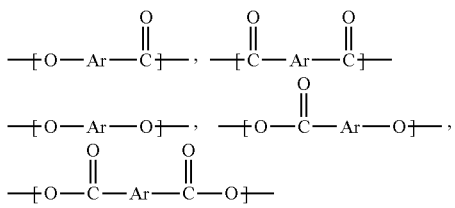

Chemical Formula 5 where, Ar is an aryl group of C4~C30.

Further, in the above Chemical Formula 6, $R^1$ and $R^2$ may be repeated in the form of block or random, for example, $Z^1R^1R^1R^1 \ldots R^2R^2R^2Z^2$, $Z^1R^1R^1R^2 \ldots R^2R^2Z^2$, $Z^1R^1R^2R^2R^2 \ldots R^1R^2Z^2$ or $Z^1R^1R^2R^1R^2 \ldots R^2R^2Z^2$.

Further, the liquid crystal thermosetting oligomer may be a compound represented by Chemical Formula 7 or Chemical Formula 8 below:

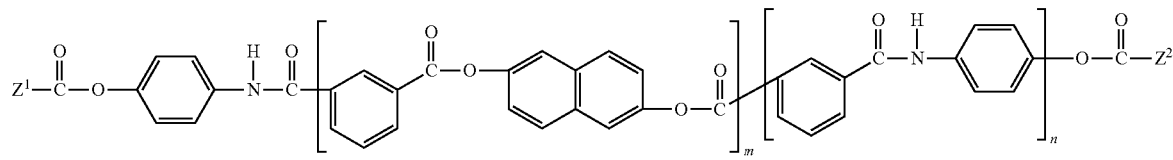

Formula 7

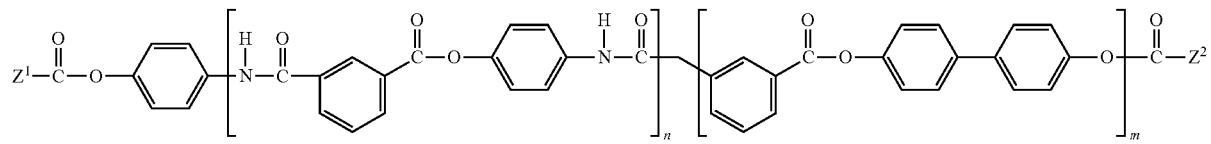

Formula 8 wherein $Z^1$ and $Z^2$ are identical to or different from each other, and are each independently selected from the group consisting of maleimide, nedimide, phthalimide, acetylene, propargyl ether, benzocyclobutene, cyanate, and substitutes or derivatives thereof; and m and n are each independently a positive integer, preferably, an integer of 1~50.

Further, in the above Chemical Formulae 6 to 8, n/(n+m+2) may be more than 5% and 60% or less.

The liquid crystal thermosetting oligomer may have a molecular weight of 500~15,000. When the molecular weight of the liquid crystal thermosetting oligomer is less than 500, its crosslink density is increased, and thus it becomes brittle. When the molecular weight thereof is more than 15,000, the viscosity of a solution is increased and it is difficult to impregnate the solution in a nonwoven glass fiber fabric.

Methods of producing the liquid crystal thermosetting oligomer are not particularly limited. The liquid crystal thermosetting oligomer can be produced by polymerizing compounds which can prepare a liquid crystal thermosetting oligomer having a soluble structural unit with compounds which can introduce a thermosetting group.

The compounds which can prepare a liquid crystal thermosetting oligomer having a soluble structural unit are not particularly limited. For example, the compounds may be one or more selected from the group consisting of aromatic, heteroaromatic or aliphatic dicarboxylic acid; aromatic, heteroaromatic or aliphatic diol; aromatic, heteroaromatic or aliphatic diamine; aminophenol; hydroxybenzoic acid; and aminobenzoic acid, preferably, aromatic, heteroaromatic or aliphatic diol; aminophenol; and aminobenzoic acid.

For example, the liquid crystal thermosetting oligomer may be produced using solution polymerization or bulk polymerization. The solution polymerization or bulk polymerization may be performed in one reaction tank provided with a suitable stirring machine.

Referring to the solution polymerization, first, isophthaloyl chloride, aminophenol, 2,6-dihydroxynaphthalene and triethylamine are put into a reactor, and then reacted with each other while being stirred at room temperature. After a predetermined amount of time has elapsed, a compound which can provide a thermosetting group (for example, maleimide-benzoyl chloride or the like, which can provide maleimide, nedimide, acetylene or the like) is added thereto and then reacted to obtain a liquid crystal thermosetting oligomer, and then the obtained liquid crystal thermosetting oligomer is separated and refined.

Referring to the bulk polymerization, first, isophthalic acid, aminophenol, 2-hydroxy-6-naphthoic acid and acetic anhydride are put into a reactor, and then slowly heated to 150° C. while being stirred, and then reacted for a predetermined amount of time under reflux to obtain a reaction product. Subsequently, the side products of acetic acid and anhydrous acetic acid are removed from the reaction product, and then 4-hydroxybenzoic acid is added to the reaction product and heated to 320° C. and then reacted therewith to synthesize a liquid crystal oligomer having alcohol groups at one or more of the two ends of a main chain thereof. Subsequently, the liquid crystal oligomer is dissolved in a solvent (for example, dimethylformamide (DMF)), and then a compound which can provide a thermosetting group is added to the dissolved liquid crystal oligomer and then reacted therewith, thereby obtaining a liquid crystal thermosetting oligomer provided with thermosetting groups at one or more of the two ends of a main chain thereof.

Further, referring to another bulk polymerization, first, isophthalic acid, aminophenol, 2-hydroxy-6-naphthoic acid and acetic anhydride are put into a reactor, and then heated to 150° C. while stirring, and then reacted for a predetermined amount of time under reflux to obtain a reaction product. Subsequently, the side products of acetic acid and anhydrous acetic acid are removed from the reaction product while heating the reaction product to 230° C. to synthesize a liquid crystal oligomer. Subsequently, nedimide-benzoic acid is added to the liquid crystal oligomer, it is heated to 250° C. and then reacted to obtain a liquid crystal thermosetting oligomer.

In the present invention, the above-mentioned liquid crystal thermosetting oligomer is used as a main matrix. Conventionally, the dielectric constant was lowered by the addition of a filler and the added amount thereof. However, in the present invention, in order to decrease the dielectric constant, a fluorine compound having a functional group which can react with a main chain of the liquid crystal thermosetting oligomer is introduced into the main chain of the liquid crystal thermosetting oligomer by covalent bonding by polymerization. For this reason, the thermal and mechanical characteristics of the liquid crystal thermosetting oligomer itself can be maintained, and the fluorine compound having a low dielectric constant can be easily and uniformly dispersed in the main matrix.

The fluorine compound, which is a compound having one or more fluorine atoms, may have a functional group which can react with the main chain of the liquid crystal thermosetting oligomer, such as —COOH, —OH, —NH$_2$ and/or —Cl. As the functional group, all commonly-known functional groups may be used without limitation as long as they can participate in a polymerization reaction.

The fluorine compound may be selected from among compounds represented by Chemical Formula 9 below, but is not limited thereto:

Chemical Formula 9

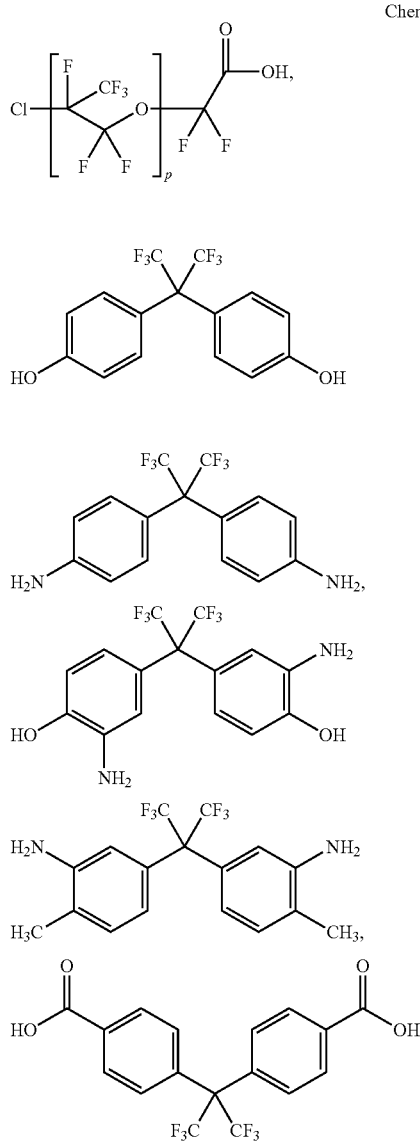

-continued

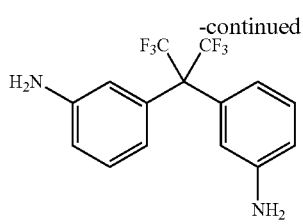

wherein p is an integer of 1~10.

Meanwhile, the polymerization product of the liquid crystal thermosetting oligomer and the fluorine compound may be synthesized, without limitation, by covalent bonding using a general polymerization process well known in the related art.

The amount of the fluorine compound used, in order to realize both the mechanical properties and low dielectric properties of the liquid crystal thermosetting oligomer, may be 5~100 parts by weight, preferably, 5~50 parts by weight based on 100 parts by Weight of the liquid crystal thermosetting oligomer, but is not limited thereto.

The composition for forming a substrate according to the present invention, if necessary, may further include an inorganic filler in order to maximize the targeted properties thereof.

Further, since the composition for forming a substrate according to the present invention can be applied to a solvent casting process, glass fiber or the like can be easily impregnated. The solvent used in the composition for forming a substrate according to the present invention is not particularly limited, but a polar nonprotonic solvent may be used as the solvent. The polar nonprotonic solvent may be selected from the group consisting of N,N-dimethylacetamide, N-methylpyrrolidone (NMP), N-methylcaprolactone, N,N-dimethylformamide, N,N-diethylformamide, N,N-diethylacetamide, N-methylpropionamide, dimethylsulfoxide, γ-butyllactone, dimethylimidazolidinone, tetramethylphosphoric amide, ethylcellosolve acetate, and mixtures thereof. The composition for forming a substrate may include 0.1~300 parts by weight of the polymerization product based on 100 parts by weight of the solvent.

Further, the composition for forming a substrate according to the present invention may further include a toughening agent in order to improve flexibility. The toughening agent is an aromatic polymer, and the aromatic polymer may have a number average molecular weight of about 2,000~500,000. Examples of such an aromatic polymer include, but are not limited to, aromatic polymers including one or more mesogenic groups selected from the group consisting of ester, ester-amide, ester-imide, ester-ether and ester-carbonate in main chains thereof. The mixing ratio of the polymerization product and the toughening agent may be 99.5:0.5~35:65.

The composition for forming a substrate according to the present invention, if necessary, may further include one or more additives selected from among a filler, a softener, a plasticizer, a lubricant, an antistatic agent, a coloring agent, an antioxidant, a thermostabilizer, a photostabilizer and a UV absorber. Examples of the filler include organic fillers, such as polytetrafluoroethylene (PTFE) resin powder, epoxy resin powder, melamine resin powder, urea resin powder, benzoguanine resin powder, styrene resin powder and the like, and inorganic fillers, such as silica, alumina, titania, zirconia, kaolin, calcium carbonate, calcium phosphate and the like.

The composition for forming a substrate can be used as a packaging material because it has high adhesivity to copper foil, low expandability and excellent heat resistance and mechanical properties. The composition for forming a substrate can be formed into a substrate or can be made into a varnish for impregnating or coating. The composition can be used to manufacture printed circuit boards (PCBs), multilayered substrates, copper clad laminates (CCLs), resin coated copper foils (RCCs), films for tape automated bonding (TAB) and the like, but the uses of the composition are not limited thereto.

In order to use the composition as a material of a substrate, the composition is cast and cured on the substrate.

The composition for forming a substrate according to the present invention may be formed into a prepreg by impregnating it into a nonwoven glass fiber fabric, or may be used as an insulating material of a substrate, such as a printed circuit board or the like, by forming it into a buildup film.

The prepreg is formed by impregnating a reinforcing material with the composition. Specifically, the composition for forming a substrate is impregnated in a reinforcing material and then cured to form a sheet-shaped prepreg. Examples of the reinforcing material, may include, but are not limited to, a woven glass fiber, a woven alumina glass fiber, a nonwoven glass fiber fabric, a nonwoven cellulose fabric, a woven carbon fiber, a polymer fabric and the like. The composition for forming a substrate may be impregnated into the reinforcing material using a dip coating method, a roll coating method or a general impregnating method.

A substrate can be manufactured using the composition for forming a substrate. Examples of the substrate may include, but are not limited to, multilayered substrates, laminates coated with metal foil, printed circuit boards, and the like. Further, examples of the substrate may include prepregs coated metal foils.

The substrate may have various shapes, particularly, a film shape. A film-shape substrate can be manufactured by making the composition for forming a substrate into a thin film.

The substrate, other than the film-shaped substrate, may be manufactured in the form of a laminate coated with a metal foil. The thickness of the metal foil may be 5~100 μm according to the use of the substrate. The laminate coated with metal foil may be manufactured into a printed circuit board by forming a circuit on the metal foil of the laminate. Further, the printed circuit board may be manufactured into a multilayered printed circuit board by layering and processing the laminates coated with metal foil thereon.

Examples of the laminates coated with metal foil include, but are not limited to, resin coated copper foils (RCCs), copper clad laminates (CCLs) and the like.

Hereinafter, the present invention will be described in more detail with reference to the following Examples. However, the scope of the present invention is not limited thereto.

Example 1

A. Synthesis of 4-nedimide benzoic acid 32.83 g (0.2 mol) of 5-norbornene-2,3-dicarboxylic acid anhydride and 400 Ml of glacial acetic acid were put into a 1000 Ml flask, heated to 110° C. to dissolve, and then 41.1 g (0.3 mol) of excess 4-aminobenzoic acid was added thereto to form a mixed solution. Subsequently, the mixed solution was stirred and reacted for 2 hours, and was then precipitated at room temperature. Subsequently, the precipitate was washed with glacial acetic acid and water, and was then dried in a vacuum oven at 60° C. to prepare 4-nedimide benzoic acid in 95% yield.

B. Synthesis of Polymerization Product 10.789 g (0.065 mol) of isophthalic acid, 47.948 g (0.254 mol) of 6-hydroxy-2-naphthenic acid, 14.187 g (0.130 mol) of 4-aminophenol and 58.396 g (9.5 mol) of acetic acid anhydride were put into a 500 Ml flask provided with a condenser and a mechanical stirrer, slowly heated to 140° C. under a nitrogen atmosphere, and then reacted with each other for 3 hours at 140° C. to complete the acetylated reaction. Subsequently, 36.79 g (0.130 mol) of the 4-nedimide benzoic acid prepared in step A and 27.25 g of chloro-terminated monocarboxylic acid polyhexafluoropropylene oxide were added to the acetylated product, heated to 215° C. at a rate of 1~2° C./min while removing acetic acid, which is a side product, and unreacted acetic acid anhydride, and then reacted with each other for 4 hours to obtain a polymerization product represented by Chemical Formula 10 below, which includes a fluorine compound in the main chain thereof and is provided with a nedimide group at one or more of the two ends of the main chain thereof.

[Chemical Formula 10]

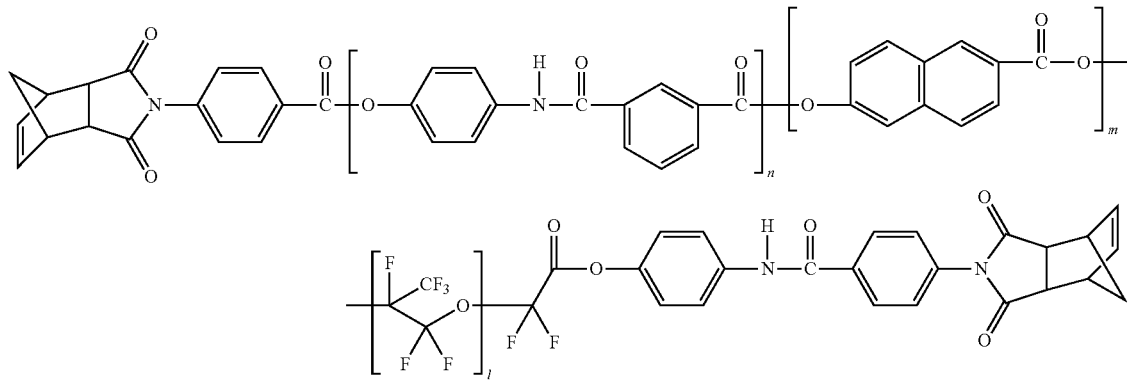

wherein n, m and 1 are each independently an integer of 1~50.

The thermal expansion coefficient (CTE) and dielectric constant of a film obtained from the polymerization product represented by Chemical Formula 10 above were measured, and the results thereof are given in Table 1 below. The thermal expansion coefficient (CTE) of the film was measured under a heating rate of 10° C./min in a state in which nitrogen was purged. The thermal expansion coefficient (CTE) is an average value of thermal expansion coefficients measured in a temperature range of 50~100° C.

Example 2

A. Synthesis of 4-maleimide-benzoyl chloride 41.1 g (0.3 mol) of p-aminobenzoic acid and 300 ME of acetic acid were put into a 250 Ml flask, dissolved, and then 29.4 g (0.3 mol) of maleic acid anhydride was slowly added at 10° C. to obtain a yellow precipitate. This yellow precipitate was recrystallized using a mixed solution of DMF and ethanol (50:50, w/w). The recrystallized intermediate was treated at 85° C. for 15 minutes using sodium acetate and acetic acid anhydride, cooled to room temperature, and then precipitated using an ice water bath to obtain a precipitate. The obtained precipitate was recrystallized using a mixed solution of ethyl acetate and n-hexane (50:50, w/w) to obtain N-(p-carboxyphenyl) maleimide.

15 g (0.07 mol) of the obtained N-(p-carboxyphenyl) maleimide was mixed with 80 Ml of benzene to form a mixture. Then, 21.83 g (0.172 mol) of oxalyl chloride was slowly added to the mixture, heated and refluxed for 2 hours. Subsequently, unreacted oxalyl chloride was removed from the mixture, and then the mixture was cooled to room temperature, filtered and then washed with hexane to prepare 4-maleimide-benzoyl chloride.

B. Synthesis of Polymerization Product

100 Ml of dimethylformamide was put into a 250 Ml flask, and then 3.274 g (0.03 mol) of aminophenol and 4.655 g (0.025 mol) of 4,4-dihydroxybiphenyl and 18 Ml of triethylamine were added and dissolved to form a mixed solution. Then, the mixed solution was cooled using ice water, and then 10.151 g (0.05 mol) of isopropyl alcohol was added to the cooled mixed solution. The resulting product was reacted at room temperature for 60 hours, washed with water and ethanol, and then dried.

Subsequently, 1 g of the dried sample was dissolved in 9 g of NMP to form a mixed solution, and then 0.1 g of 4-maleimide-benzoyl chloride prepared in step A, 0.1 g of chloroterminated monocarboxylic acid polyhexafluoropropylene oxide and 10 Ml of triethylamine were added to the mixed solution and then reacted at room temperature for 12 hours to obtain a polymerization product represented by Chemical Formula 11 below, which includes a fluorine compound in the main chain thereof and is provided with a nedimide group at one or more of the two ends of the main chain thereof.

Comparative Example 1

The thermal expansion coefficient (CTE) and dielectric constant of a film obtained from epoxy resin-bisphenol A diglycidyl ether (DGEPA) were measured, and the results thereof are given in Table 1 below. The thermal expansion coefficient (CTE) of the film was measured under a heating rate of 10° C./min in a state in which nitrogen was purged. The thermal expansion coefficient (CTE) is an average value of thermal expansion coefficients measured in a temperature range of 50~100° C.

Comparative Example 2

The thermal expansion coefficient (CTE) and dielectric constant of a film obtained from a PTFE resin (SFLON) were measured, and the results thereof are given in Table 1 below. The thermal expansion coefficient (CTE) of the film was measured under a heating rate of 10° C./min in a state in which nitrogen was purged. The thermal expansion coefficient (CTE) is an average value of thermal expansion coefficients measured in a temperature range of 50~100° C.

TABLE 1

| | Example 1 | Example 2 | Comp. Example 1 | Comp. Example 2 |
|---|---|---|---|---|
| Dielectric constant | 2.8 | 2.9 | 4.3 | 3.2 |
| Thermal expansion coefficient (ppm/° C.) | 32.4 | 31.3 | 75 | 70 |

As shown in Table 1, the films (Examples 1 and 2) formed using the polymerization product of the liquid crystal thermosetting oligomer and fluorine compound according to the present invention have a lower dielectric constant and thermal expansion coefficient than the conventional films (Comparative Examples 1 and 2). Therefore, it is expected that the composition for forming a substrate according to the present

[Chemical Formula 11]

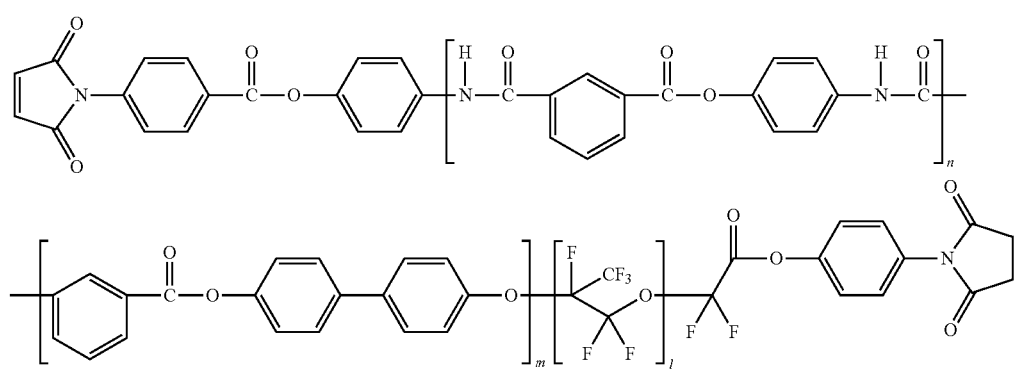

wherein n, m and l are each independently an integer of 1~50.

The thermal expansion coefficient (CTE) and dielectric constant of a film obtained from the polymerization product represented by Chemical Formula 11 above were measured, and the results thereof are given in Table 1 below. The thermal expansion coefficient (CTE) of the film was measured under a heating rate of 10° C./min in a state in which nitrogen was purged. The thermal expansion coefficient (CTE) is an average value of thermal expansion coefficients measured in a temperature range of 50~100° C.

invention will exhibit excellent thermal, mechanical and electrical properties when it is used as an insulating material of a printed circuit board of a high-speed circuit and a high-frequency region.

As described above, according to the present invention, a fluorine compound having a low dielectric constant is introduced into the main chain of a liquid crystal thermosetting oligomer by covalent bonding, thus realizing low dielectric characteristics and easily dispersing fluorine components in a matrix. For this reason, the composition for forming a substrate according to the present invention has a uniform dielectric constant, and can thus be used as an insulating material of a printed circuit board of a high-speed circuit and a high-frequency region.

Further, according to the present invention, since the thermal and mechanical properties of a liquid crystal thermosetting oligomer itself are maintained, the composition of the present invention can be used as an insulating material of a substrate, which exhibits a dielectric constant and thermal expansion coefficient which are lower than conventional epoxy-based materials.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

Simple modifications, additions and substitutions of the present invention belong to the scope of the present invention, and the specific scope of the present invention will be clearly defined by the appended claims.

What is claimed is:

1. A composition for forming a substrate, comprising:
a compound prepared by polymerizing a liquid crystal thermosetting oligomer having one or more soluble structural units in a main chain thereof and having a thermosetting group at one or more of two ends of the main chain thereof with a fluorine-containing compound having a functional group which is reactive with the main chain of the liquid crystal thermosetting oligomer.

2. The composition for forming a substrate according to claim 1, wherein the soluble structural unit includes an arylamine group of C4~C30 or an aryl-amide group of C4~C30.

3. The composition for forming a substrate according to claim 1, wherein the soluble structural unit includes a compound represented by Chemical Formula 1 below:

Chemical Formula 1

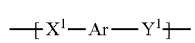

wherein Ar is an aryl group of C4~C30; and $X^1$ and $Y^1$ are each independently selected from the group consisting of COO, O, CONR", NR'" and CO, in which R" and R'" are each independently selected from the group consisting of a hydrogen atom, an alkyl group of C1~C20 and an aryl group of C6~C30, and one or more of $X^1$ and $Y^1$ are CONR" or NR'".

4. The composition for forming a substrate according to claim 3, wherein the soluble structural unit includes one or more structural units selected from compounds represented by Chemical Formula 2 below:

Chemical Formula 2

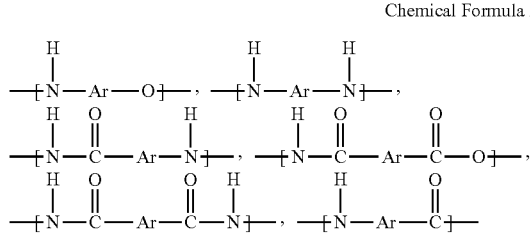

wherein Ar is an aryl group of C4~C30.

5. The composition for forming a substrate according to claim 4, wherein the Ar is an aryl group or a substitute thereof selected from among compounds represented by Chemical Formula 3 below:

Chemical Formula 3

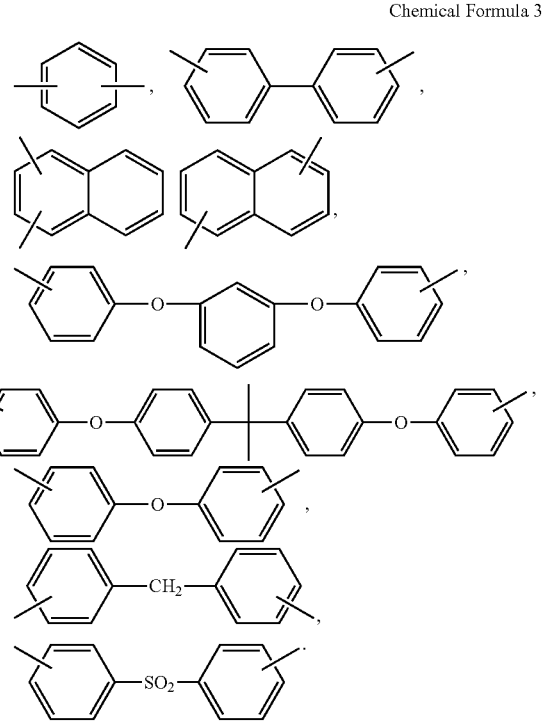

6. The composition for forming a substrate according to claim 1, wherein the soluble structural unit is included in a molar ratio of more than 5 mol % and 60 mol % or less based on a total of structural units.

7. The composition for forming a substrate according to claim 1, wherein the liquid crystal thermosetting oligomer further includes a structural unit represented by Chemical Formula 4 below in a main chain thereof:

Chemical Formula 4

wherein Ar is an aryl group of C4~C30; and $X^2$ and $Y^2$ are each independently selected from the group consisting of COO, O, CONR", NR'" and CO, in which R" and R'" are each independently selected from the group consisting of a hydrogen atom, an alkyl group of C1~C20 and an aryl group of C6~C30.

8. The composition for forming a substrate according to claim 7, wherein the structural unit represented by Chemical Formula 4 above includes one or more structural units selected from compounds represented by Chemical Formula 5 below:

Chemical Formula 5

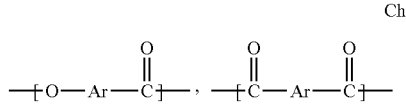

-continued

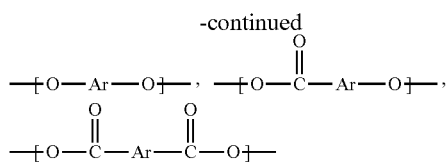

wherein Ar is an aryl group of C4~C30.

9. The composition for forming a substrate according to claim 8, wherein the Ar is selected from among compounds represented by Chemical Formula 3 below:

Chemical Formula 3

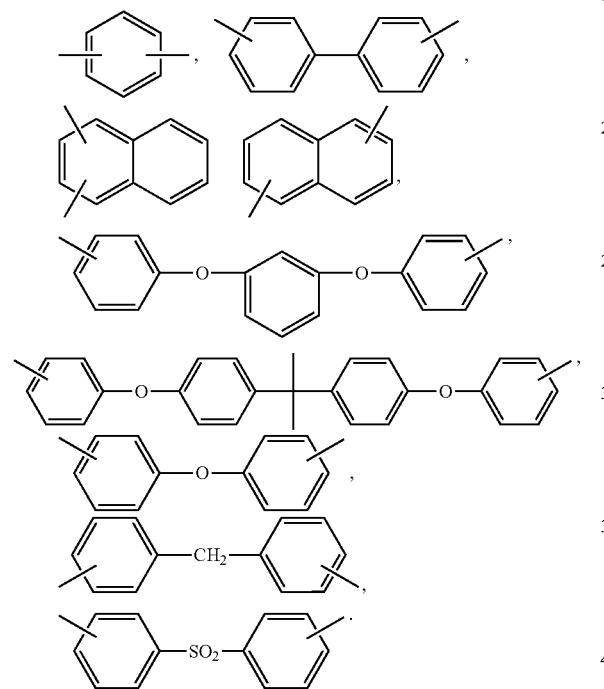

10. The composition for forming a substrate according to claim 1, wherein the thermosetting group is a thermo-crosslinkable reaction group.

11. The composition for forming a substrate according to claim 1, wherein the thermosetting group is selected from the group consisting of maleimide, nedimide, phthalimide, acetylene, propargyl ether, benzocyclobutene, cyanate, and substitutes or derivatives thereof.

12. The composition for forming a substrate according to claim 1, wherein the liquid crystal thermosetting oligomer is a compound represented by Chemical Formula 6 below:

$$Z^1-(R^1)_m-(R^2)_n-Z^2$$    Chemical Formula 6 wherein $R^1$ is one or more structural units selected from among compounds represented by Chemical Formula 2 below; $R^2$ is one or more structural units selected from among compounds represented by Chemical Formula 5 below; $Z^1$ and $Z^2$ are identical to or different from each other, and are each independently selected from the group consisting of hydrogen, halogen, a hydroxy group, maleimide, nedimide, phthalimide, acetylene, propargyl ether, benzocyclobutene, cyanate, and substitutes or derivatives thereof; one or more of $Z^1$ and $Z^2$ are selected from the group consisting of maleimide, nedimide, phthalimide, acetylene, propargyl ether, benzocyclobutene, cyanate, and substitutes or derivatives thereof; n and m are each independently an integer of 1~50; and $n/(n+m+2)$ is from more than 5% to 60% or less:

Chemical Formula 2

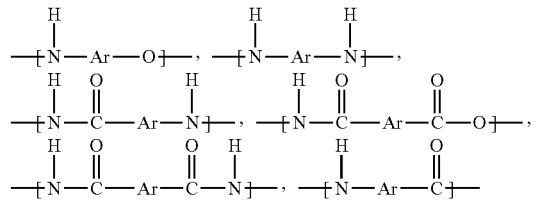

where, Ar is an aryl group of C4~C30;

Chemical Formula 5

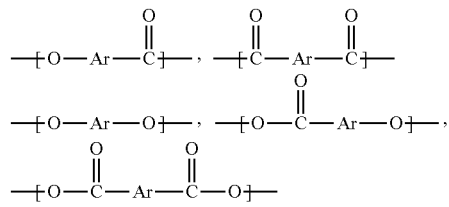

where, Ar is an aryl group of C4~C30.

13. The composition for forming a substrate according to claim 1, wherein the liquid crystal thermosetting oligomer is a compound represented by Chemical Formula 7 or Chemical Formula 8 below:

Chemical Formula 7

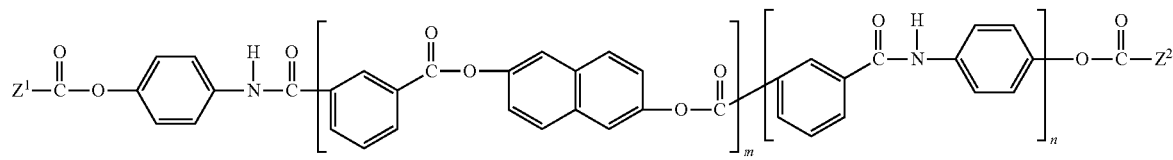

Chemical Formula 8

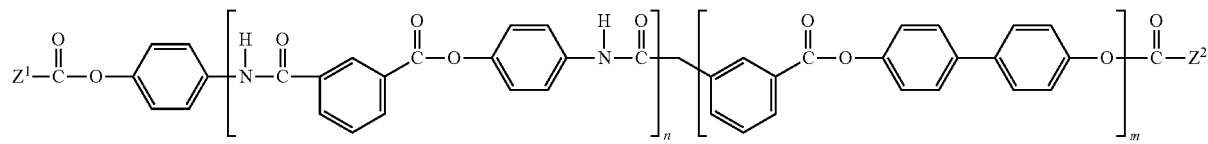

wherein $Z^1$ and $Z^2$ are identical to or different from each other, and are each independently selected from the group consisting of maleimide, nedimide, phthalimide, acetylene, propargyl ether, benzocyclobutene, cyanate, and substitutes or derivatives thereof; m is an integer of 1~50; and n is an integer of 1~50.

14. The composition for forming a substrate according to claim 1, wherein the liquid crystal thermosetting oligomer has a number average molecular weight of 500~15000.

15. The composition for forming a substrate according to claim 1, wherein the functional group which can react with the main chain of the liquid crystal thermosetting oligomer is one or more selected from among —COOH, —OH, —NH$_2$ and —Cl.

16. The composition for forming a substrate according to claim 1, wherein the fluorine-containing compound is selected from among compounds represented by Chemical Formula 9 below:

Chemical Formula 9

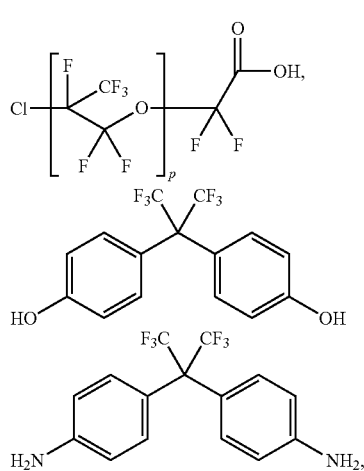

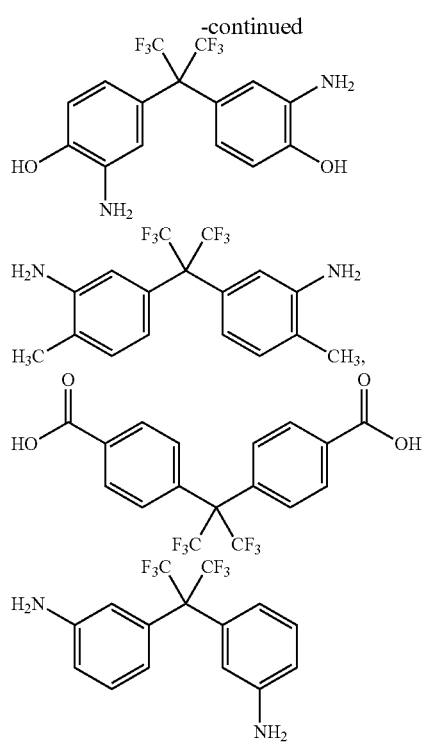

wherein p is an integer of 1~10.

17. The composition for forming a substrate according to claim 1, further comprising: an inorganic filler.

18. A prepreg comprising the composition of claim 1.

19. A substrate manufactured using the composition of claim 1.

* * * * *